(12) United States Patent  
Pham

(10) Patent No.: US 7,129,489 B2  
(45) Date of Patent: Oct. 31, 2006

(54) METHOD AND APPARATUS PROVIDING SINGLE BUMP, MULTI-COLOR PIXEL ARCHITECTURE

(75) Inventor: Le Thanh Pham, Ventura, CA (US)

(73) Assignee: Raytheon Company, Waltham, MA (US)

( * ) Notice: Subject to any disclaimer, the term of this patent is extended or adjusted under 35 U.S.C. 154(b) by 111 days.

(21) Appl. No.: 11/003,637

(22) Filed: Dec. 3, 2004

(65) Prior Publication Data

US 2006/0118722 A1    Jun. 8, 2006

(51) Int. Cl.
*G01J 5/20*    (2006.01)
(52) U.S. Cl. .................................................. 250/338.4
(58) Field of Classification Search ............ 250/338.4, 250/370.13; 257/188, 442, 614
See application file for complete search history.

(56) References Cited

U.S. PATENT DOCUMENTS

| 3,553,536 | A | * | 1/1971 | Neilson ....................... 257/610 |
| 4,679,063 | A | * | 7/1987 | White ........................ 257/187 |
| 5,113,076 | A |   | 5/1992 | Schulte .................. 250/370.06 |
| 5,149,956 | A |   | 9/1992 | Norton ....................... 250/211 |
| 5,373,182 | A |   | 12/1994 | Norton ....................... 257/440 |
| 5,380,669 | A |   | 1/1995 | Norton ........................... 437/5 |
| 5,721,429 | A |   | 2/1998 | Radford et al. .......... 250/338.4 |
| 5,731,621 | A |   | 3/1998 | Kosai ........................ 257/440 |
| 5,751,005 | A |   | 5/1998 | Wyles et al. ........... 250/370.06 |
| 6,049,116 | A |   | 4/2000 | Park et al. .................. 257/442 |
| 6,147,349 | A |   | 11/2000 | Ray ........................ 250/338.4 |
| 6,455,908 | B1 | * | 9/2002 | Johnson et al. ............. 257/440 |
| 6,548,751 | B1 |   | 4/2003 | Sverdrup |

FOREIGN PATENT DOCUMENTS

| GB | 2 127 619 | A |   | 4/1984 |
| JP | 59048963 | A | * | 3/1984 |
| JP | 09232616 | A | * | 9/1997 |

* cited by examiner

*Primary Examiner*—Constantine Hannaher
(74) *Attorney, Agent, or Firm*—William C. Schubert; Karl A. Vick

(57) ABSTRACT

An infrared detector has a multi-layer structure to simultaneously detect IR energy in different spectral bands without changing polarity of a bias imposed across the detector. Two absorption layers are separated by a barrier layer that imposes an electrical potential barrier to one of the absorption layers. Under low bias in one direction, only one layer generates a photocurrent. Under a higher bias in the same direction, both layers generate a photocurrent. Additional absorption layers may be added to detect additional bands of energy, where the additional absorption layers generate photocurrent under a bias in another direction. Two, three, and four band detection is disclosed. Where absorbing layers within a single unit cell absorb under different bias direction, the barrier layer between those different bias direction layers suppresses a diffusing electron current. A method for detecting and resolving energy absorbed in two, three, and four different energy bands is also provided.

19 Claims, 13 Drawing Sheets

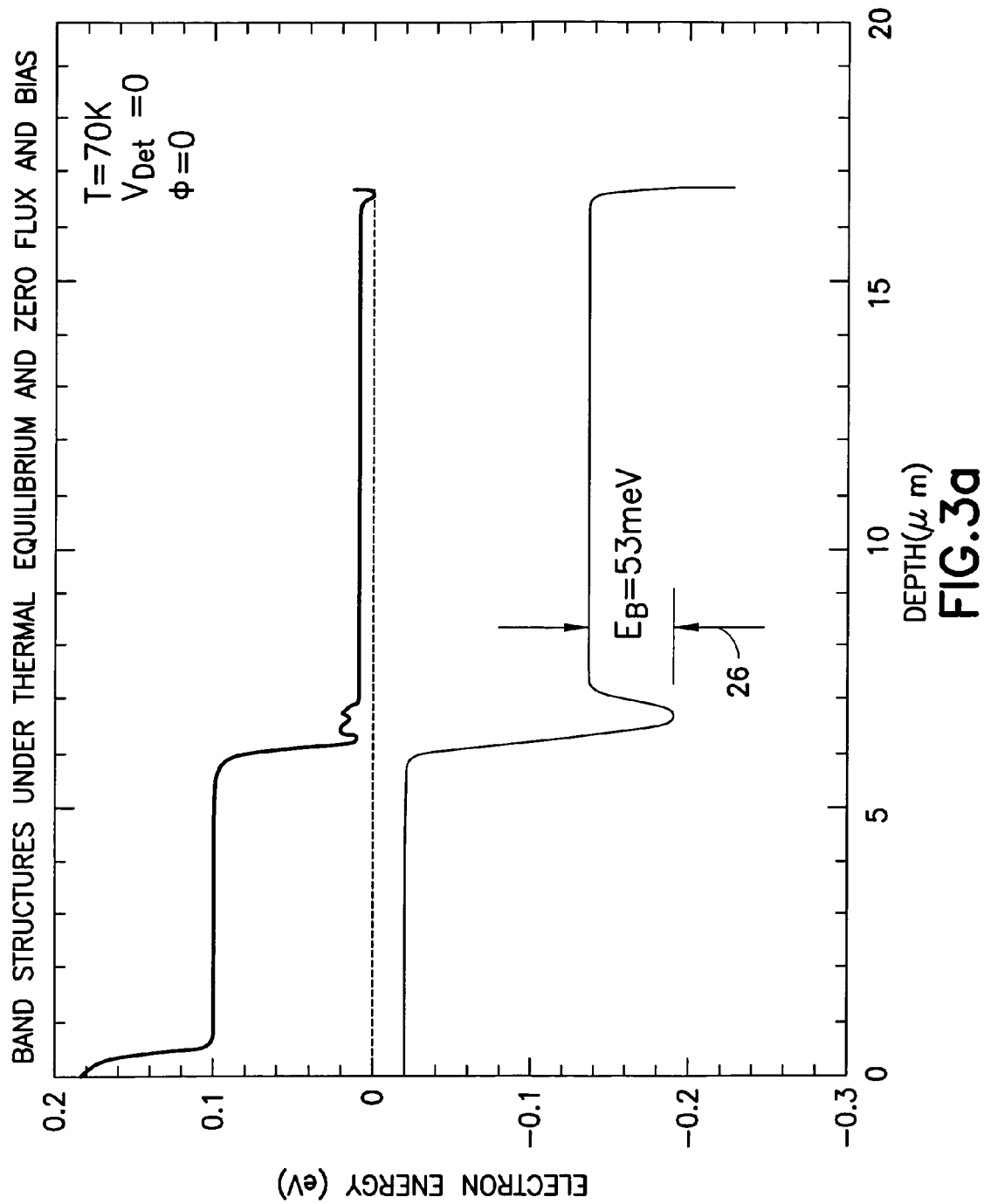

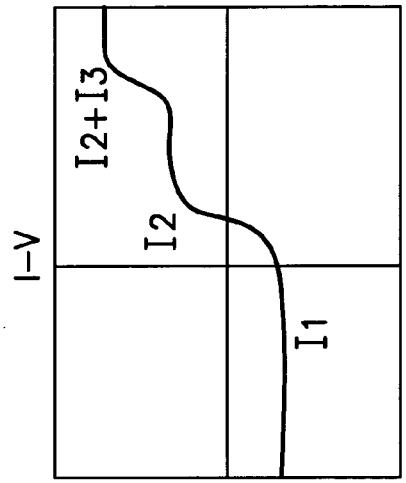
FIG.5e
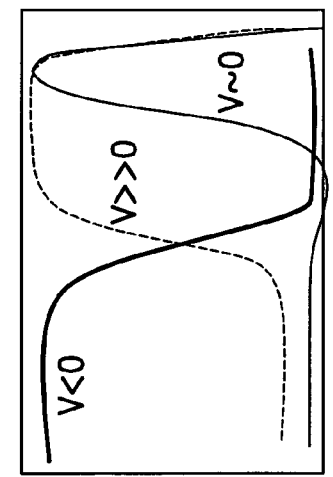
FIG.5f
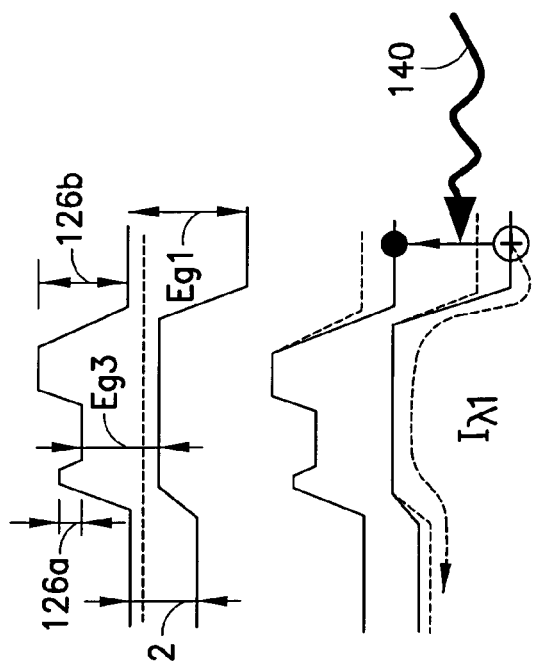
FIG.5a
FIG.5b
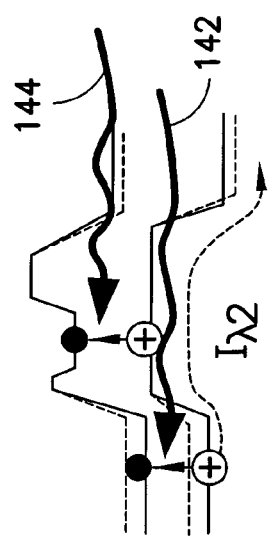
FIG.5c
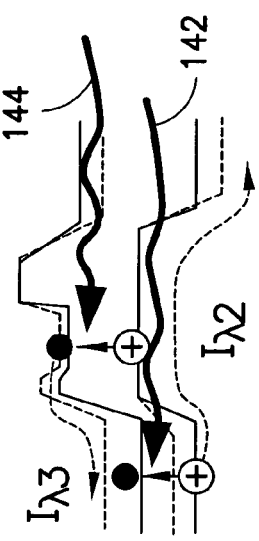
FIG.5d

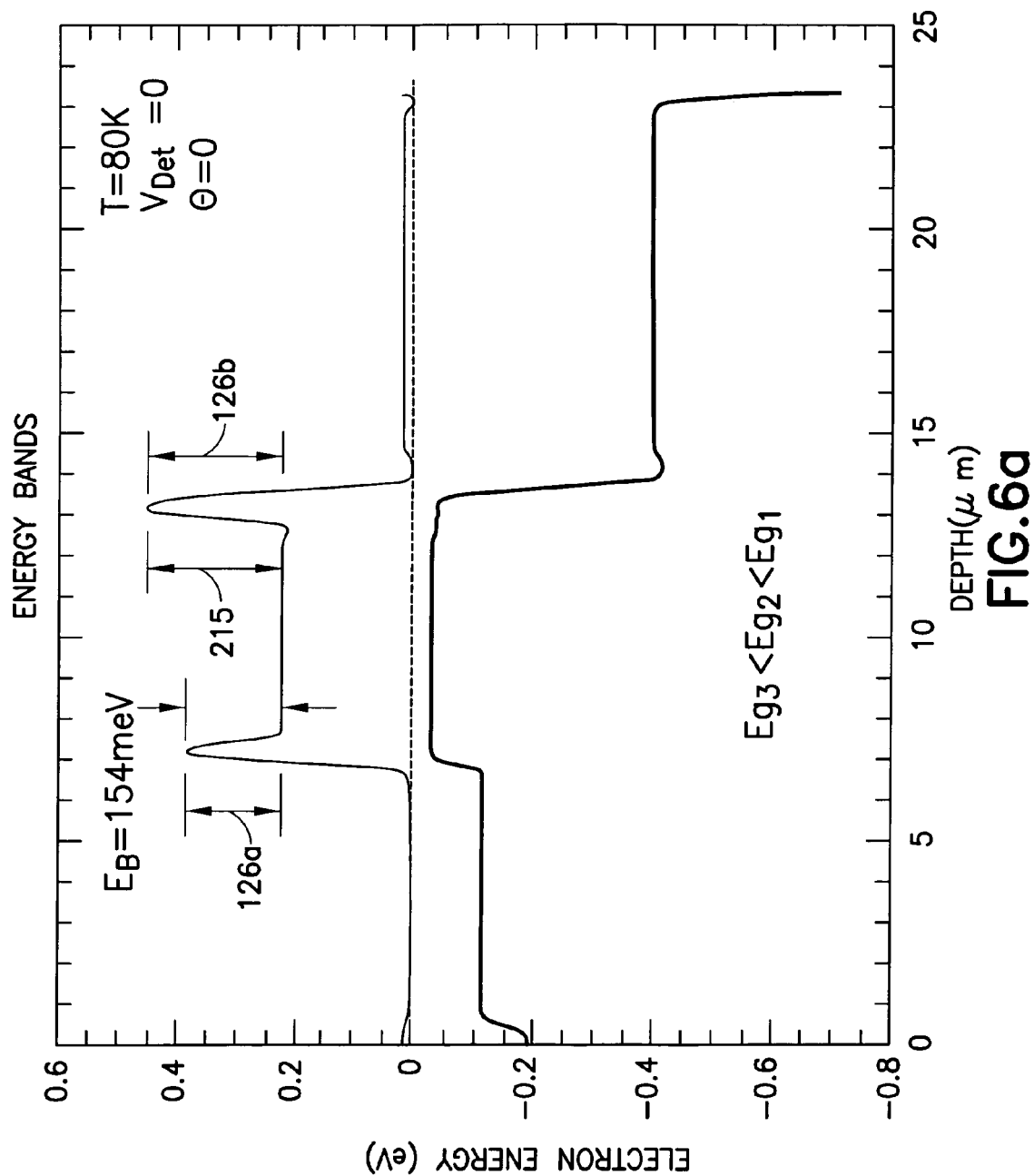

EQUILIBRIUM, Vbias=0V

SMALL BIAS Vdet<0V

LARGE BIAS Vdet<<0V

METHOD AND APPARATUS PROVIDING SINGLE BUMP, MULTI-COLOR PIXEL ARCHITECTURE

FIELD OF THE INVENTION

This invention relates generally to solid-state radiation detectors and, more specifically, relates to radiation detectors that are sensitive to radiation within a plurality of spectral bands or "colors".

BACKGROUND

One desirable type of photo detector is a two-color infrared radiation (IR) detector having simultaneous sensitivity in two spectral bands. The spectral bands may include short wavelength IR (SWIR), medium wavelength IR (MWIR), long wavelength IR (LWIR), and very long wavelength IR (VLWIR). An array of two color IR detectors may be employed in a number of imaging applications wherein it is required to simultaneously detect radiation within two spectral bands from a scene within a field of view of the array. By example, the array may be responsive to LWIR and MWIR, or to LWIR and SWIR. A two-color detector is disclosed in now commonly assigned U.S. Pat. No. 5,113,076, issued May 12, 1992, entitled "Two Terminal Multiband Infrared Radiation Detector" to E. F. Schulte. Schulte discloses a radiation detector having two heterojunctions that function in a manner analogous to two back-to-back photodiodes. Each of the photodiodes is responsive to radiation within a different IR spectral band, such as LWIR and MWIR. Detection of a particular wavelength band is achieved by switching a bias supply. Disclosed configurations include an n-p-n configuration, a p-n-p configuration, and a p-n-p-n configuration. Reference is also made to now commonly assigned U.S. Pat. No. 5,149,956, issued Sep. 22, 1992, entitled "Two-Color Radiation Detector Array and Methods of Fabricating Same", by P. R. Norton. This patent describes the formation of a substantially continuous common layer between semiconductor regions responsive to different wavelength bands (e.g., MWIR and LWIR). A contact is made to the common layer for coupling same to readout electronics. Reference is also made to now commonly assigned U.S. Pat. No. 5,380,669, issued Jan. 10, 1995, entitled "Method of Fabricating a Two-Color Radiation Detector Using LPE Crystal Growth", by P. R. Norton. This patent describes the use of Liquid Phase Epitaxy (LPE) to grow an n-type LWIR layer, a p-type MWIR layer, and an n-type MWIR layer on a sacrificial substrate. A passivation layer is then formed over the n-type MWIR layer, an IR transparent substrate is bonded to the passivation layer, and the sacrificial substrate is then removed. The resulting structure is then further processed to form an array of two-color detectors.

Further in this regard reference can be had to now commonly assigned U.S. Pat. No. 5,457,331, issued Oct. 10, 1995, entitled "Dual Band Infrared Radiation Detector Optimized for Fabrication in Compositionally Graded HgCdTe", by K. Kosai and G. R. Chapman.

Reference can also be made to commonly assigned U.S. Pat. No. 5,751,005, issued May 12, 1998, entitled "Low-Crosstalk Column Differencing Circuit Architecture for Integrated Two-color Focal Plane Arrays", by Richard H. Wyles and William H. Frye. This patent describes an integrated two-color staring focal plane array having rows and columns of photo detector unit cells, each being capable of simultaneously integrating photocurrents resulting from the detection of two spectral bands.

Most existing two-color devices that are known to the inventor are based on two-junction structures that involve two p-n junctions per pixel. However, having two junctions requires two separate input circuits at the unit cell level. In small geometry and more complex designs, it is not always possible to place two complex circuits within a small footprint.

In commonly assigned U.S. Pat. No. 6,103,544, issued Aug. 15, 2000, entitled "Multiple Color Infrared Detector", Peter D. Drieske and Sebastian R. Borrello describe a multiple color infrared detector formed from a photodiode, a photoconductor, and an insulating layer of material disposed between the photodiode and the photoconductor. The photodiode detects infrared radiation in the spectral band between about 3 microns and about 5 microns, and the photoconductor detects infrared radiation in the spectral band between about 8 microns and about 13 microns. While this multiple color device includes only a single p-n junction per pixel, a plurality of electrical contacts (112, 118, 122, 126) are used per pixel. In order to accommodate the multiple contacts, the optical fill factor is generally less than 75%.

Some existing small geometry pixel designs use a single-connection (single indium bump or more simply "single bump" design and rely on the readout integrated circuit (ROIC) unit cell to perform complex functions such as time division multiplexing (TDM). While this approach may satisfy many applications, it fails to meet other requirements such as gamma-suppression, or a footprint of less than 20 microns per unit cell.

Also of interest to this invention is now commonly assigned U.S. Pat. No. 5,731,621, issued Mar. 24, 1998, entitled "Three Band and Four Band Multispectral Structures Having Two Simultaneous Signal Outputs", by Kenneth Kosai. This patent describes a solid-state array that has a plurality of radiation detector unit cells, where each unit cell includes a bias-selectable two-color detector or a single photo detector. Each unit cell is thereby capable of simultaneously outputting charge carriers resulting from the absorption of electromagnetic radiation within two spectral bands selected from one of four spectral bands or three spectral bands. In various embodiments a plurality of electrical contacts are used, such as a first, common contact, a second contact for outputting the bands 1 and 2 photocurrent, and a third contact for outputting the bands 3 and 4 photocurrent, or the band 3 photocurrent.

In the prior art, IR diodes are made with either N-on-P or P-on-N, where one of the layers is designed to absorb in the target energy range and the other layer is designed to suppress energy outside the target range. The function of the layers is altered by changing current direction, thereby changing the target energy bands absorbed and suppressed. What is needed in the art is a multi-color detector capable of simultaneously detecting energy in different bands without changing current direction, where the detector is amenable to manufacture at less than about 20 microns per unit cell.

SUMMARY OF THE PREFERRED EMBODIMENTS

The foregoing and other problems are overcome, and other advantages are realized, in accordance with the presently preferred embodiments of these teachings. As an overview of advantages attainable using detectors embodying various aspects of the present invention, such advantages include: sensing at least two infrared spectral bands using a single radiation detector having a single indium bump; providing two or more color detection without changing the detector polarity; and a multi-color bias-selectable detector in which each layer functions as an absorbing layer to absorb a selected infrared spectra. In the latter embodiment, the bias polarity and/or magnitude applied to the detector enables one or more detector layers to detect the specific infrared spectra absorbed by those layers, so that two or more energy bands may be detected based on the bias.

In accordance with the present invention, a detector for detecting radiation in the infrared region that is incident upon the detector is provided. The detector includes at least one detector unit cell, and a common contact and a contact bump coupled to the unit cell for imposing a bias condition across the unit cell, such as a voltage bias. The unit cell itself includes a first and second absorption layer and a barrier layer disposed between the absorption layers. The first absorption layer is either and n-type or a p-type charge carrier, and outputs a corresponding charge carrier current that is proportional to absorption of energy by the first layer in a first energy band when a bias in a first direction (i.e., forward or reverse) is imposed across the unit cell. The second absorption layer is the other of an n-type or p-type, and outputs a corresponding charge carrier current that is proportional to absorption of energy by the second layer in a second energy band when a bias in that same first direction is imposed across the unit cell. This is not to say that the same magnitude bias in the same direction causes each absorbing layer to conduct. That is distinguished by the barrier layer. The barrier layer imposes an electric potential barrier between the absorbing layers, allowing photocurrent from the first absorption layer to flow when an imposed bias in the first direction is below a threshold voltage, and allowing photocurrent from both the first and second absorbing layers to flow when an imposed bias in the first direction exceeds the threshold voltage. Additional absorbing and barrier layers may be added so that a photocurrent is generated by at least one absorbing layer under each of low and high bias in each of forward and reverse directions. Any combination of layers to resolve any particular band of energy absorption is also possible.

In accordance with another aspect of the invention is a method for detecting infrared energy in different energy bands. The method includes providing a detector with unit cells defining at least two absorption layers separated by a barrier layer, and imposing an appropriate bias direction across at each unit cell of the detector. Next, a first photocurrent is measured that represents absorption in a first energy band. Another bias level is imposed in appropriate direction across each unit cell of the detector. A second photocurrent is measured that represents absorption in both a first and second energy band. A difference between the first and second photocurrent is determined to resolve energy detected in the second energy band. Further aspects of the method are described below and in the ensuing claims.

BRIEF DESCRIPTION OF THE DRAWINGS

The foregoing and other aspects of these teachings are made more evident in the following Detailed Description of the Preferred Embodiments, when read in conjunction with the attached Drawing Figures, wherein:

FIG. 3 (a) illustrates a doping profile of a uni-polar 2-color detector and the x-value of $Hg_{1-x}Cd_xTe$ vs. depth;

FIG. 5(a)–(f) depicts basic band structures and forms a functional description of a 3-color detector operating under a bias;

FIG. 6(a) illustrates an energy band profile of a 3-color detector versus depth;

DETAILED DESCRIPTION OF THE PREFERRED EMBODIMENTS

Figure 1:
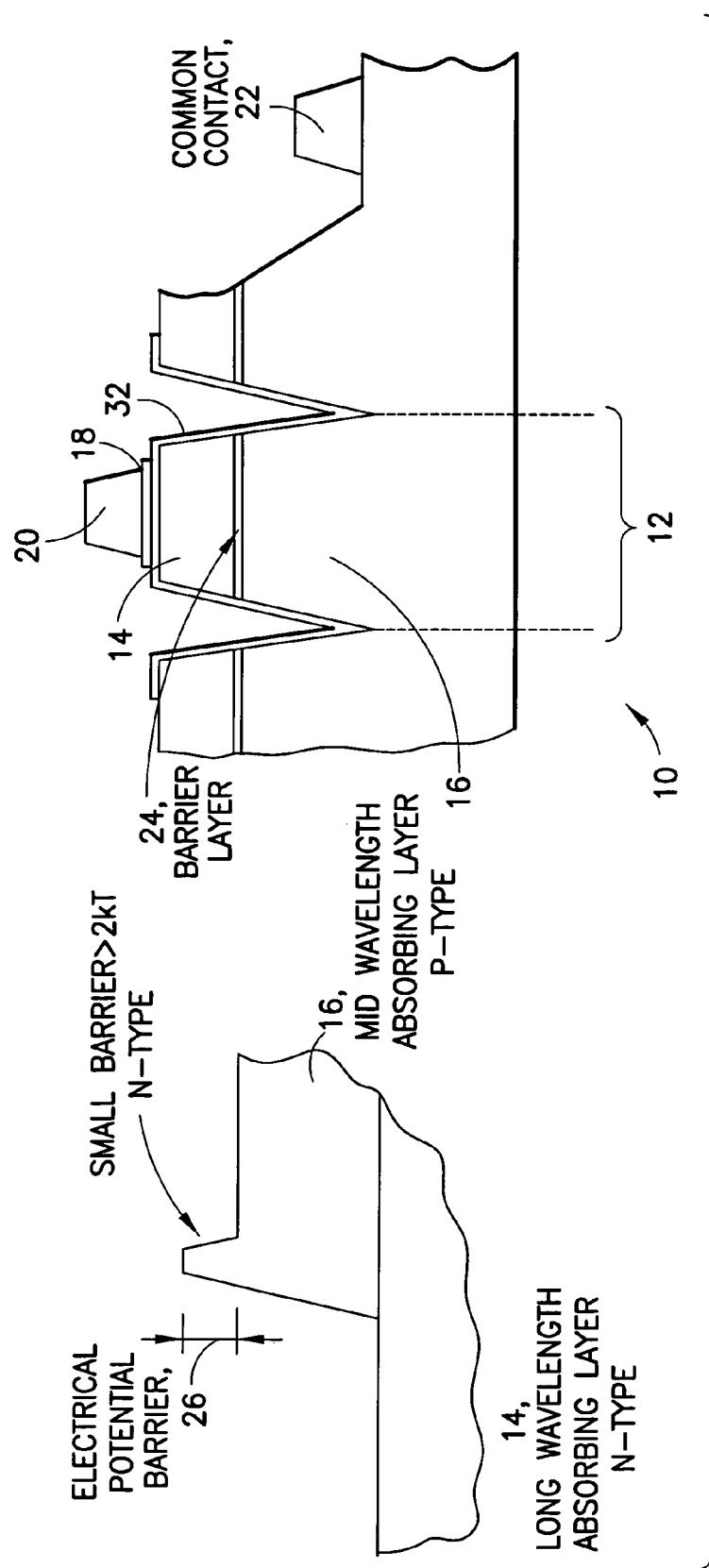
FIG. 1 is a cross-sectional view of a unit cell of a 2-color detector having one indium bump and illustrating a common contact.

The detector of the present invention relates to multi-color bias-selectable radiation detectors. The detector may detect two, three or four different infrared spectra or colors, and include a unit cell divided into a plurality of layers having certain electrical conductivities and responsive to certain incoming infrared spectra photons. Each of the layers of the detector act as an absorbing layer to the specific incoming infrared spectra to which it is responsive. However, the detector itself only detects certain infrared spectra that have been absorbed by the absorbing layers depending upon the applied bias across the detector. By alternating the applied bias, for example the polarity and/or magnitude of the bias, different infrared spectra may be absorbed by one of the plurality of absorbing layers.

In general, the spectral regions or bands that may be utilized by various embodiments of this invention include, but are not limited to, short wavelength infra red (SWIR, approximately 0.8–3 micrometers), mid-wavelength IR (MWIR, approximately 3–8 micrometers), long wavelength IR (LWIR, approximately 8–12 micrometers), very long wavelength IR (VLWIR, approximately 12–20 micrometers), and the far IR (FIR, approximately 20–1000 micrometers).

Barrier potentials are also formed between each adjacent absorbing layer of the detector unit cell in order to prevent excited carriers generated from incoming infrared spectra photons absorbed in one absorbing layer from crossing into an adjacent absorbing layer. Under a sufficiently high bias, the electric barrier potential is overcome and excited carriers from one absorbing layer cross into an adjacent absorbing layer, thereby enabling two separate infrared signals to be separately measured simultaneously. A signal processor is preferably used to separate absorption by the different layers to resolve the two separate infrared signals. A more detailed discussion of the preferred embodiments of the present invention is set forth below that references the drawing figures.

FIG. 1 illustrates in cross section view a uni-polar 2-color detector 10 of a first embodiment of the present invention, which is enabled to detect two spectral bands without changing the detector polarity. The detector 10 in the first embodiment is preferably a back-side illuminated radiation detector comprised of $Hg_{1-x}Cd_xTe$. It should be realized however that the invention can be practiced with radiation detectors comprised of other materials selected from Groups II–VI of the periodic table of the elements, and also with materials from Groups III–V such as GaAs, GaAlAs and InP, and also with Si devices such as Si doped with platinum. In general, the teaching of the invention is applicable to photovoltaic radiation detectors made with a semiconductor material that is fashioned to provide different energy bandgaps, such as by selectively doping or growing the material.

Specifically, in the first embodiment of the present invention, the detector 10 includes $Hg_{1-x}Cd_xTe$ as the absorption layer. The detector 10 may be an array of unit cells 12, each having a first absorbing layer 14 having a specific electrical conductivity and having an energy band gap [Eg1 of FIG. 2(a)] responsive to infrared radiation in a first spectral region or band, and a second absorbing layer 16 having a specific electrical conductivity and having an energy band gap [Eg2 of FIG. 2(b)] responsive to infrared radiation in a second spectral region. In an exemplary embodiment, the first absorbing layer 14 is preferably about 10 microns thick and is n-type doped for spectral response in the desired spectral band, preferably LWIR. The second absorbing layer 16 is preferably about 6 microns thick and is p-type doped for spectral response in the desired spectral band, preferably MWIR.

The invention can also be practiced to fabricate detectors with radiation selective material other than the MWIR//LWIR arrangement depicted, such as SWIR/LWIR, and other combinations in accordance with the present invention. In general, the arrangement of photoresponsive layers 14, 16 is usually such that incident radiation first encounters the shorter wavelength absorbing regions. When operational, incident radiation typically impinges the detector and unit cells from a direction opposite the indium bump, the bottom of FIG. 1.

The first 14 and second 16 absorbing layers are stacked upon one another to a form a heterojunction. Further, the first and second absorbing layers are coupled in series to one another via a first electrical contact pad 18, preferably of nickel, having an indium bump 20 or other contact bump protruding from the unit cell 12, and via a common contact 22, also of nickel or other suitable electrical conductor. The contacts 18, 22 also couple the unit cell 12 during use to bias and readout (ROIC) circuitry. In particular, the common contact 22 functions as a ground or other common potential to the n-type first absorbing layer 14. As is well known in the art, the indium bump 20 is used to electrically connect to readout (ROIC) circuitry, not shown. The uni-polar two-color detector 10 accommodates various types of ROIC unit cell designs such as: direct-injection, buffered direct-injection, and capacitive trans impedance amplifier.

An important aspect of the detector 10 is a barrier layer 24 disposed between the first 14 and second absorbing layers 16. The barrier layer 24 forms an electrical potential barrier 26 to prevent excited electron hole carriers in the n-type first absorbing layer 14 from crossing into the p-type second absorbing layer 16 under a small bias. The barrier layer 24 is preferably about 0.1–1.0 microns thick and n-type doped as in Table 1 below. The height of the electric potential barrier is preferably about 0.05 electron volts. The total thickness of the unit cell 12 of the 2-color detector 10 is preferably about 17 microns.

The detector 10 unit cells 12 are formed by a deep isolation etch process, preferably a reaction ion etch (RIE) process to form isolated diodes. The etch depth is preferably about 8 to 10 microns in order to fully delineate the junctions between active unit cells. During processing, a passivation layer 32 is disposed over the etched trenches, and preferably the passivation layer is made from CdTe. Preferably and as depicted in each of the detector cross sections presented herein, the pixel sidewalls are in the mesa form as known in the art to focus incident radiation by providing an effective large optical collection area while also reducing leakage current and other noise generating phenomena. The RIE process has proven to be effective in producing pixel sidewalls with sufficient flatness and angles to achieve total internal reflection of the incoming IR radiation. Further details as to the pixel shape and its advantages may be found in U.S. Pat. No. 5,721,429, hereby incorporated by reference in its entirety.

Figure 2A:
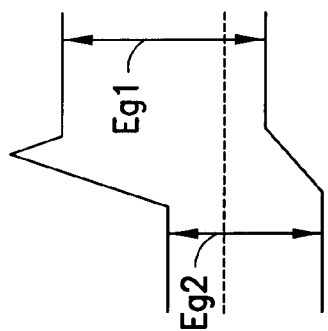
FIGS. 2(a)–(e) depicts basic band structures and forms a functional description of a unipolar 2-color detector operating under a bias.

As shown in FIG. 1, the first (n-type) absorption layer 14 and the second (p-type) absorption layer 16 of the unit cell 12 form a hetero-junction structure. For purposes of discussion, assume the first absorption layer 14 in FIG. 2(a)–(e) is responsive to MWIR and the second absorption layer 16 is responsive to LWIR. FIG. 2(a) shows the band structures under thermal equilibrium and zero flux and bias. Eg1 represents an energy band gap that matches infrared radiation in a first spectral region or band, MWIR in this example. Eg2 represents an energy band gap that matches infrared radiation in a second spectral region or band, LWIR in this example.

Figure 2D:
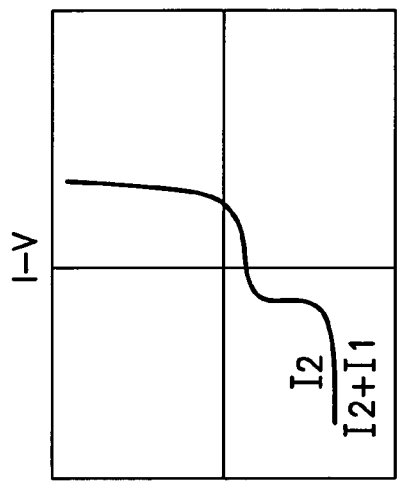
Figure 2E:
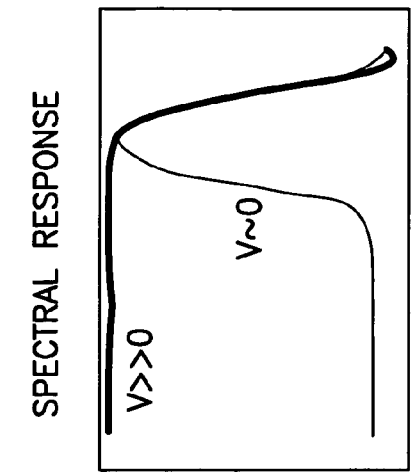
Figure 2C:
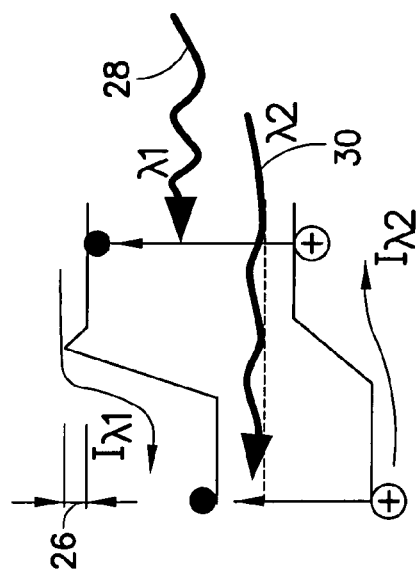
Figure 2B:
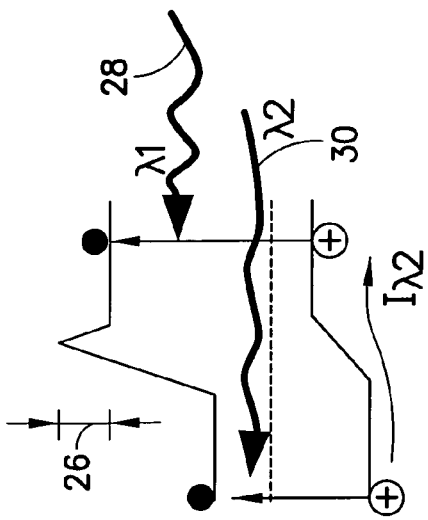

FIG. 2(b) shows the band structures under a small negative bias. Photons within the MWIR band 28 are absorbed in the first layer 14, and photons within the LWIR band 30 are absorbed in the second absorbing layer 16. The barrier layer 24 is formed at the hetero-interface to prevent photo-excited electrons generated in the n-layer 14 from flowing under applied low bias or voltage into the p-layer 16 of the unit cell 12 of detector 10. Accordingly in the case of FIG. 2(b) where low bias or voltage is applied to the detector 10, only excited carriers from the LWIR band 30 contribute to the photo current (depicted therein as $I_{\lambda 2}$), because those are the only charge carriers in the second absorbing p-layer 16.

Under a sufficiently high bias within a single polarity, the electric barrier potential 26 is lowered due to band bending. This lowering is evident in the difference in the heights of the potential barriers 26 between FIGS. 2(b) and 2(c), where FIG. 2(c) shows the band structures under a high negative bias for the same detector 10 shown in FIG. 2(b). Given the same incident radiation 28, 30 in each of FIGS. 2(b) and (c), some of the photo-excited electrons in the n-layer 14 may overcome the reduced electrical potential barrier 26 and enter the p-layer 16. These charge carriers that overcome the barrier 26 are represented in FIG. 2(c) as photo-current $I_{\lambda 1}$. Under high (negative) bias then, the total photo-current contains both $I_{\lambda 2}$ from the absorbed MWIR photons 30 and $I_{\lambda 1}$ from the absorbed LWIR photons 28 as in FIG. 2(e). Changing the detector 10 to measure radiation in two distinct bands as in FIG. 2(c) from measuring in only one band as in FIG. 2(d) is affected merely by changing the magnitude of the bias, not reversing it. The signals are separated and energy in each band is resolved during signal processing, such as by an ROIC coupled to the indium bump 20 and the common contact 22 as known in the art.

Table 1 below stipulates exemplary layer thickness, doping concentration, type, and the x value (mole fraction) of the dopant $Hg_{1-x}Cd_xTe$ for the various layers 14, 16, 24 of the preferred two-color detector 10 as described with reference to FIG. 1. The tabulated numerical values are presented as examples and may be modified to optimize detector yield and performance based on specific applications and detection needs. One can also vary the material composition of absorption layers for other combinations of other IR spectral bands.

TABLE 1

Sample Layer Specifications for a Two-Color Detector

| | Thickness (μm) | Doping (cm$^{-3}$) | Type | x-Value |
|---|---|---|---|---|
| 1$^{st}$ absorption layer | 10 | 1–3 * 10$^{15}$ | n-type | 0.24 |
| 1$^{st}$ barrier layer | 0.1–1.0 | 1–3 * 10$^{15}$ | n-type | 0.28 |
| 2$^{nd}$ absorption layer | 6 | 3–10 * 10$^{16}$ | p-type | 0.22 |

Figure 3B:
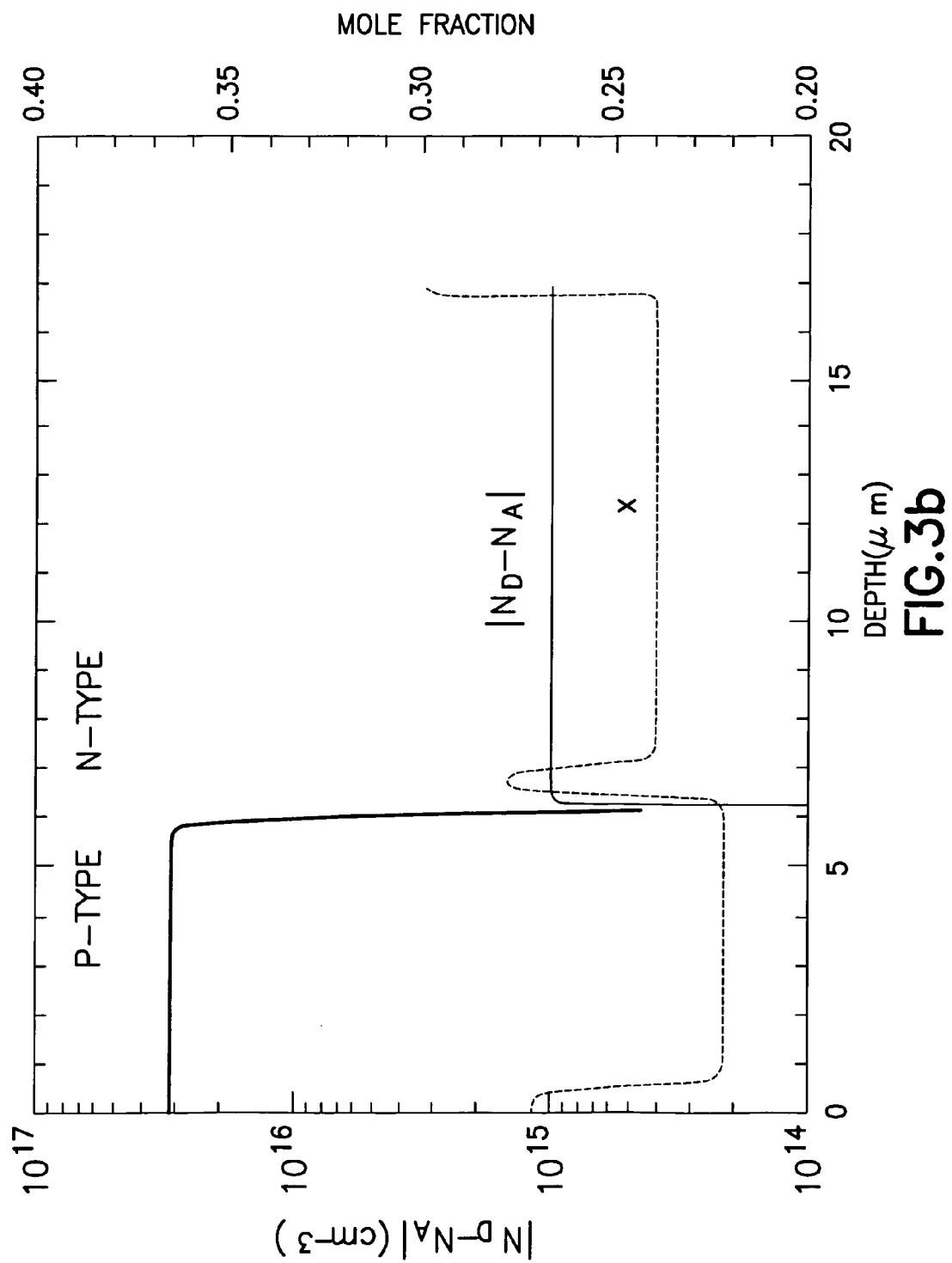
FIG. 3(b) illustrates an energy band profile of a uni-polar 2-color detector versus depth.
Figure 3C:
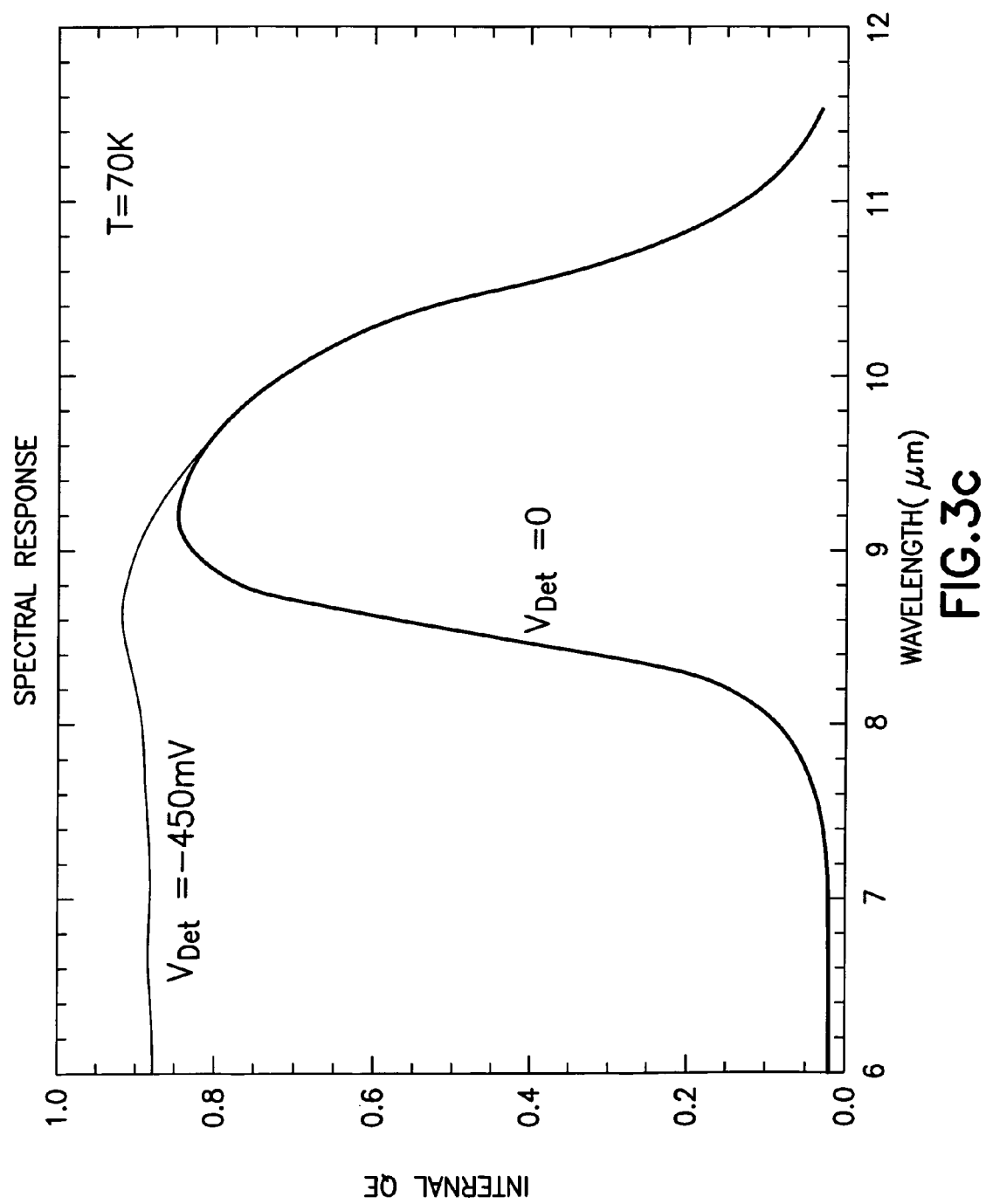
FIG. 3(c) illustrates a computer simulation of the detector spectral response curves as a function of detector applied voltages.

FIG. 3(a) is a qualitative energy profile of the two target energy bands, LWIR and MWIR, through the depth of the unit cell 12 and at thermal equilibrium and zero flux and bias. The electrical potential barrier 26 peaks at about 53 meV at a position inboard of the barrier layer 24, specifically, a total thickness from the incident surface of about seven microns. FIG. 3(b) is a doping profile of a unit cell at various depths, were the effective doping concentration $|N_D-N_A|$ is shown in logarithmic scale along the vertical axis and depth is shown along the horizontal axis. This is a graphical representation of Table 1. Incident radiation conceptually enters from the right of the graph, initially being absorbed by the first absorption layer 14 which is n-type and disposed at depths of about six to seventeen microns of the total unit cell thickness, where an incident surface upon which incident IR radiation strikes is located at the depth=0 position. The barrier layer 24 is less than one micron thick in this embodiment and is disposed at the position of about six microns total thickness from the incident surface. The second absorption layer 16 is p-type and is disposed from about zero to six microns from the incident surface. FIG. 3(c) is a quantitative spectral response curve.

Figure 4:
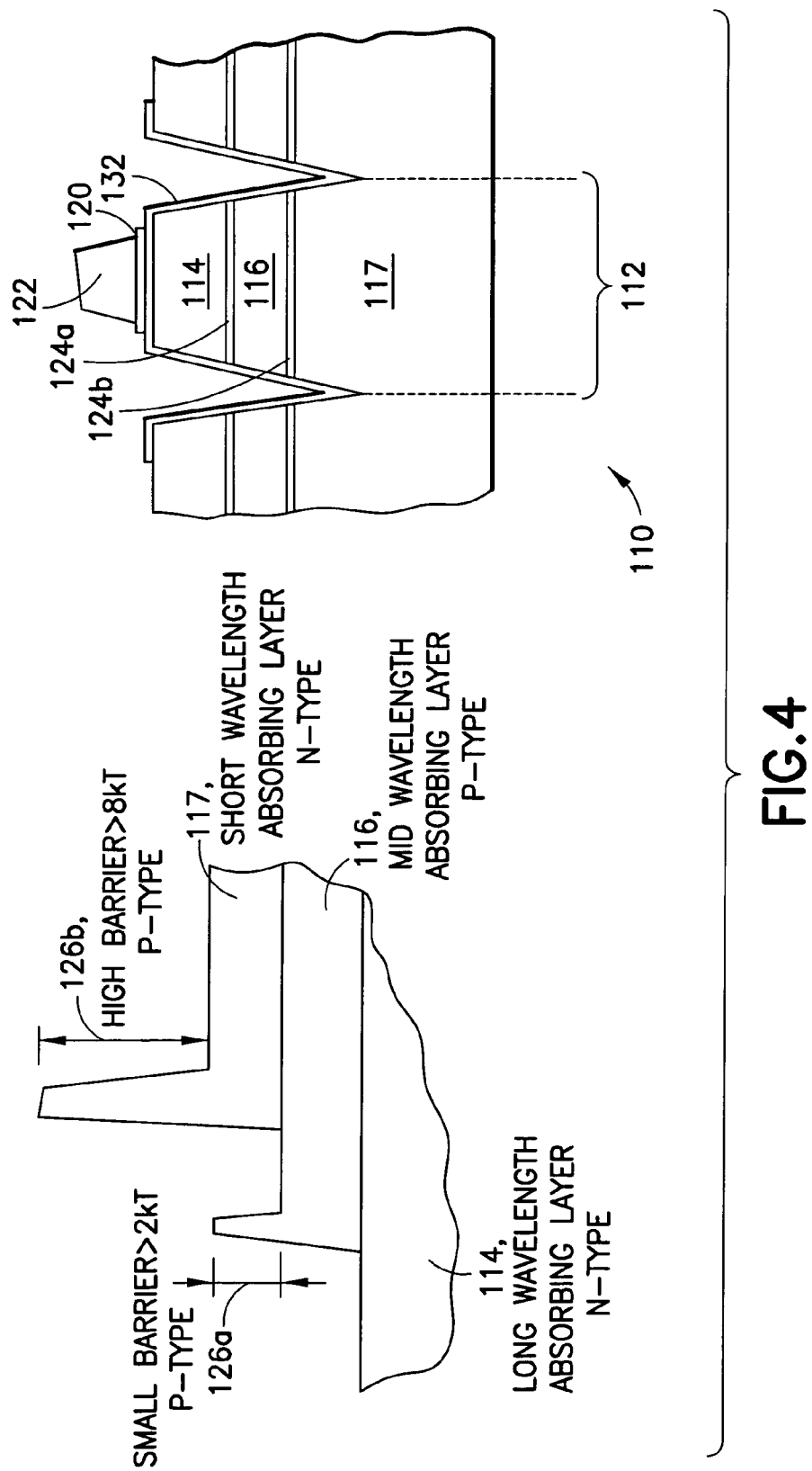
FIG. 4 is a cross-sectional view of a unit cell of a 3-color detector that employs one indium bump.

FIG. 4 is a cross section view of a three-band SWIR/MWIR/LWIR detector 110 in accordance with a second embodiment of the present invention This embodiment allows the detector 110 to detect three radiation bands with a simple single-bump detector unit cell 112. Three detecting layers are stacked to form two hetero-junctions (NPN) and provide spatial co-registration. As with the two-band detector 10 of FIG. 1, a barrier layer is disposed in between the hetero-junctions to provide an electrical potential barrier at each layer transition. The mesa shape of the unit cell 112, the passivation layer 132, contact bump 122 and pad 120, and common contact (not shown in FIG. 4) are substantially as described with reference to FIG. 1. The detector 110 pixels are formed by an etch process to form isolated diodes in a very similar manner as described for the processing of the 2-color detector 10 of FIG. 1. The etch depth is about 18 to 20 microns in order to fully delineate the junctions between the active pixels.

Specific to FIG. 4, a first absorption layer 114 is an n-type layer and absorbs LWIR; a second absorption layer 116 is a p-type layer and absorbs MWIR, and a third absorption layer is an n-type layer and absorbs SWIR. Disposed between the first 114 and second 116 layers is a first barrier layer 124a. The first barrier layer 124a imposes a first electrical potential barrier 126a to transitions of electrons or holes from the first 114 to the second 116 absorption layers. Similarly, disposed between the second 116 and third 117 absorption layers is a second barrier layer 124b. The second barrier layer 124b imposes a second electrical potential barrier 126b to transitions from the second 116 to the third 117 absorption layers. Preferably, the first absorbing layer 114 is about 6 microns thick, the second absorbing layer 116 is about 6 microns thick, and the third absorbing layer 117 is about 10 microns thick.

Under a certain applied bias and depending upon the electrical conductivity type (e.g. n-type or p-type doping) of the first and second absorbing layers, the first heterojunction (between the first 114 and second 116 layers) will either be in forward bias (inactive like a shunt resistor) and the second heterojunction (between the second 116 and third 117 layers) will be in reverse bias (active); or the first heterojunction will be in reverse bias and the second heterojunction will be in forward bias.

The first barrier layer 124a is similar to that detailed with reference to FIG. 1: preferably a highly doped n-type layer about 1.0 micron thick, though less thickness is acceptable. The height of the electric potential barrier 126a imposed by the first barrier layer 124a is preferably within 50 meV of 150 meV and most preferably about 150 meV. The second barrier layer 124b is not necessarily identical to the first 124a. Preferably, the second barrier layer 124b is a heterojunction bipolar transistor (HBT), gain-suppression barrier that forms an electric HBT potential barrier 126b. The HBT potential barrier 124b passively suppresses a diffusing electron current, thereby eliminating a transistor effect that would otherwise occur between the second 116 and third 118 absorbing layers. In this regard, the HBT barrier potential 128b is a higher potential barrier than the first 126a, effectively dividing the first 114 and second 116 absorbing layer into one region or junction and the third absorbing layer 118 into a separate second region or junction. The HBT barrier layer 124b should preferably be at least 1 micron thick. The HBT barrier potential 126b should have a height of greater than 150 meV, and preferably greater than about 200 meV. The total thickness of the unit cell 112 of three-band detector 110 is preferably about 24 microns. While the above is an exemplary embodiment, the second barrier layer 124b may alternatively be disposed between the first 114 and second 116 absorption layers.

For purposes of discussion, assume the first absorption layer 114 in FIGS. 4 and 5(a)–(e) is responsive to LWIR, the second absorption layer 116 is responsive to MWIR, and the third absorption layer 117 is responsive to SWIR. FIG. 5(a) shows the band structures under thermal equilibrium and zero flux and bias. Eg1 represents an energy band gap that matches infrared radiation in a first spectral region or band, SWIR in this example. Eg2 represents an energy band gap that matches infrared radiation in a second spectral region or band, MWIR in this example. Eg3 represents an energy band gap that matches infrared radiation in a third spectral region or band, LWIR in this example.

FIG. 5(b) shows the band structures under a negative bias. Photons 140 within the SWIR band are absorbed in the third layer 117, and a photocurrent $I_{\lambda,1}$ is generated by hole excitation from absorption of incident energy within that band by photons whose energy exceeds Eg1. FIG. 5(c) illustrates the band structure when the detector is under a small positive bias. Photons 142 whose energy is greater than Eg2 generate excited hole current, which is in the LWIR band and is depicted as photocurrent $I_{\lambda,2}$. Excited electrons, due to photons 144 whose energy is greater than Eg3, are blocked by the second potential barrier 126a and do not generate a current.

Under a sufficiently high bias within a single polarity, the second electric barrier potential 126a is lowered due to band bending, which is evident in the comparison between FIGS. 5(c) and (d) of the heights of the smaller potential barriers. FIG. 2(d) shows the band structures under a higher positive bias than that of FIG. 2(c). Given the same incident radiation 142, 144 in each of FIGS. 5(c) and (d), some of the photo-excited electrons 144 in the band of the second absorption layer 116, MWIR, may overcome the reduced electrical potential barrier 126a and enter the first layer 114. These charge carriers that overcome the barrier 126a are represented in FIG. 5(d) as photo-current $I_{\lambda 3}$.

Figure 6B:
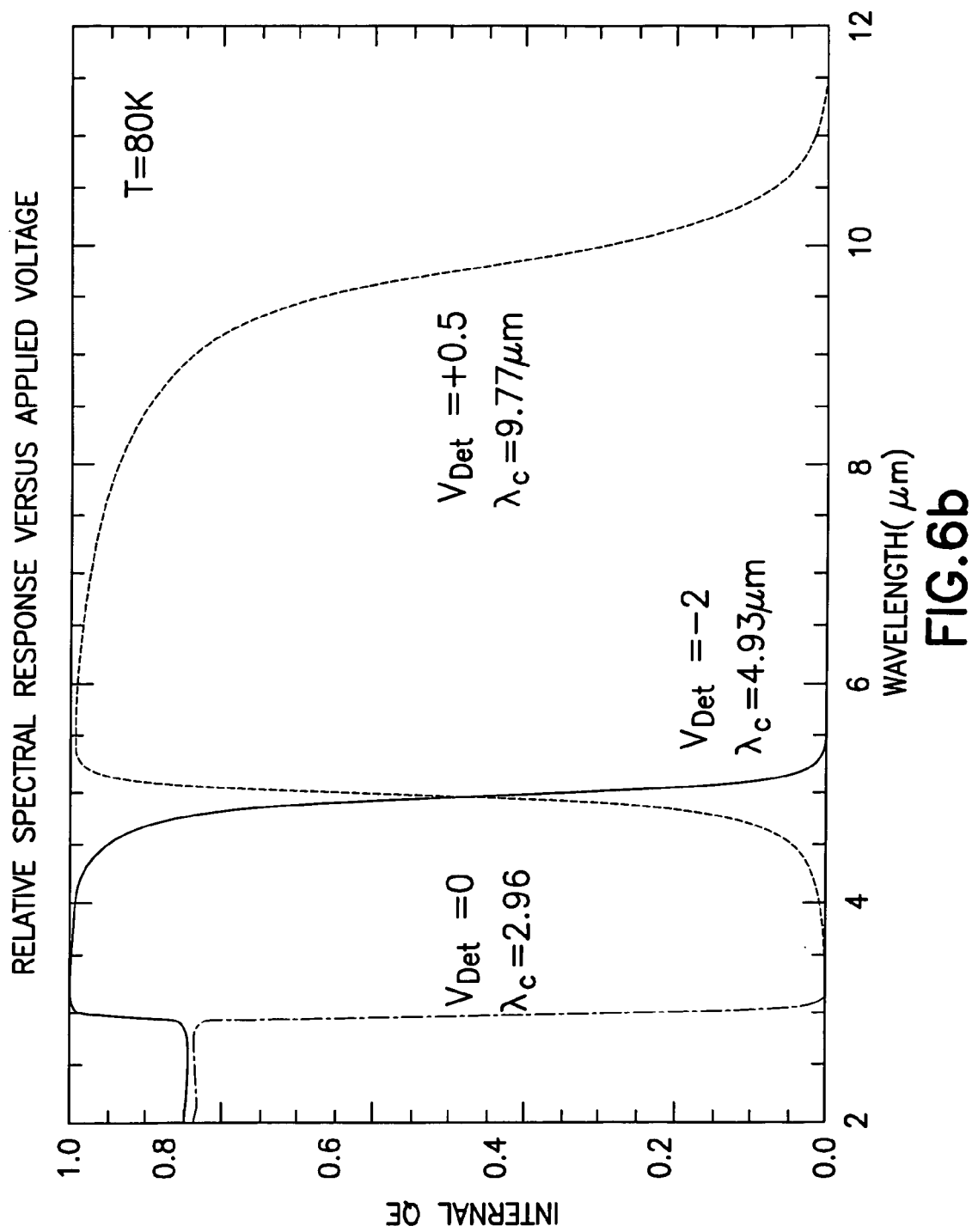
FIG. 6(b) illustrates a computer simulation of the detector spectral response curves as a function of detector applied voltage for the 3-color detector.

The three color detector 110 is therefore capable of detecting one band under one bias (e.g., negative bias for SWIR) and two bands when the bias is reversed (e.g., high positive bias for LWIR and MWIR), where no two bands are alike. That result is evident in FIG. 5(e). Under a negative bias, the total photo-current contains only $I_{\lambda 1}$, the SWIR current. Under a positive bias, both $I_{\lambda 2}$ from the absorbed LWIR photons 142 and $I_{\lambda 3}$ from the absorbed MWIR photons 144 are present in the photocurrent when the positive bias is high, but only the MWIR photons 144 are present at low positive bias. The spectral response curve of FIG. 6(b) shows the same in a different format. Signal processing to separate the MWIR signal from the LWIR signal by imposing small positive bias, sensing the current which is entirely driven by the LWIR photons 142, increasing bias, sensing the resultant current which is driven by both LWIR and MWIR photons 142, 144, and subtracting from the latter the first-sensed current to yield a photocurrent driven only by the MWIR photons 144.

The inventors have developed and tested various three-color detectors according to the present invention, of which Table 2 below stipulates exemplary layer thickness, doping type, and (the x value or mole fraction) for the dopant $Hg_{1-x}Cd_xTe$ for the various layers 114, 116, 117, 124a, 124b of the three-band detector 110 as described with reference to FIG. 4. The tabulated numerical values are presented as examples and may be modified to optimize detector yield and performance based-on specific applications and detection needs. One can also vary the material composition of absorption layers for other combinations of other IR spectral bands.

TABLE 2

Sample Layer Specifications for a Three-Color Detector

| | Thickness (μm) | Doping (cm$^{-3}$) | Type | x-Value |
|---|---|---|---|---|
| 1st absorption layer | 6 | 1–3 * 10$^{15}$ | n-type | 0.22 |
| 1st barrier layer | 1 | 3–10 * 10$^{16}$ | p-type | 0.40 |
| 2nd absorption layer | 6 | 3–10 * 10$^{16}$ | p-type | 0.3 |
| HBT barrier layer | 1 | 3–10 * 10$^{16}$ | p-type | 0.46 |
| 3rd absorption layer | 10 | 1–3 * 10$^{15}$ | n-type | 0.40 |

By way of example, operation of the 3-color detector 110 of the present invention, illustrated in FIGS. 6(a)–(b), is discussed below. For instance and as shown in FIG. 6(a), if a small (~0.5V) positive bias were applied to detector 110, the detector 110 would sense only the longest wavelength photons (LWIR band) 142 and the photocurrent would be only $I_{\lambda 2}$. The first barrier potential 126a due to the first barrier layer 124a block excited electrons and holes generated in the third 117 and second 116 absorbing layers from flowing into and contributing to the photocurrent, which is generated only in the first 114 absorbing layer. The detector 110 under a large positive bias (e.g. ~0.5 volt), the potential barrier 126a due to the first barrier layer 124a while acting as HBT barrier, transmits the energy absorbed by the second absorption layer 116 contributes to the total photocurrent, which is $I_{\lambda 3}$.

In the reverse bias, a large negative bias effectively lowers the potential barrier 126b imposed by the HBT barrier layer 124b from that shown in FIG. 6(a) therefore allows currents generated from both the second absorption 116 and the third 117 layers to be detected. Under this condition, the total photo current is $I_{\lambda 2}+I_{\lambda 3}$.

Qualitative results for the three-band detector 110 specified in Table 2 are shown in FIGS. 6(a) and 6(b). Under no bias, zero phase, and at an absolute temperature T=80K, the potential barrier 126a due to the first barrier layer 124a is about 154 meV, and the potential barrier 126b due to the HBT barrier layer 124b is about 215 meV. The horizontal axis of FIG. 6(a) shows depth, and the potential barrier peaks show the location of the barrier layers 124a, 124b relative to an incident surface of the unit cell 112, which is located at a depth of about 23 microns in FIG. 6(a).

Figure 7:
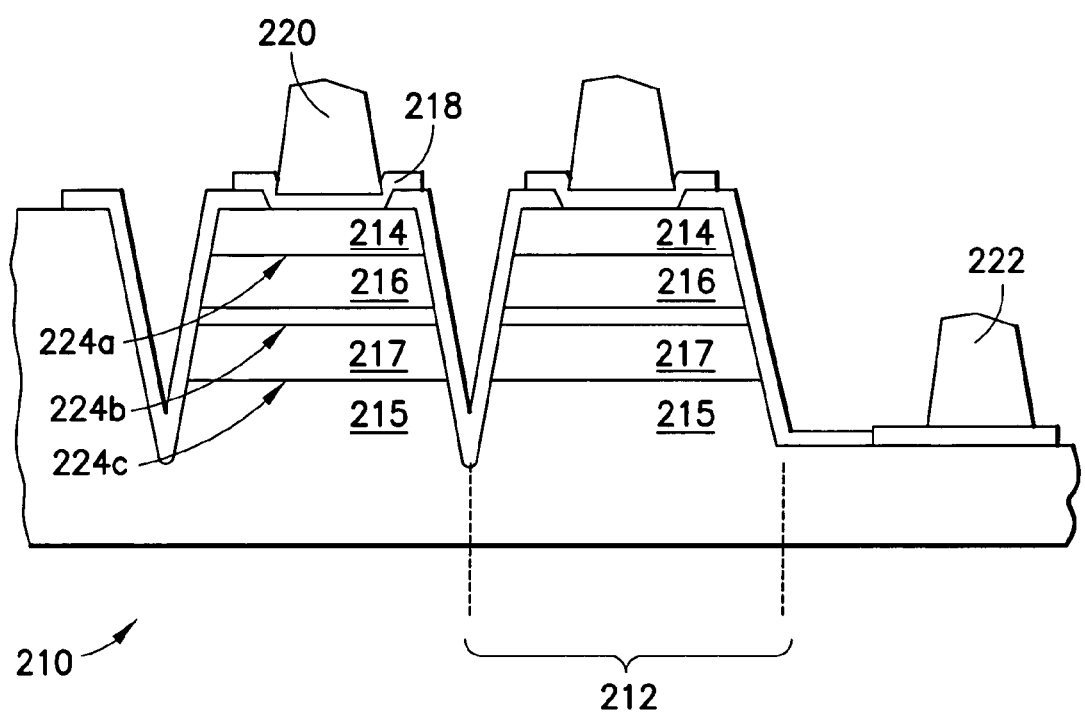
FIG. 7 is a cross-sectional view of two unit cells of a 4-color detector, each having a single indium bump and coupled to a common contact.

FIG. 7 depicts in cross section a four-band detector 210 having, similar to the detector of FIG. 1, a contact pad 218, contact bump 220, common contact 222, and a passivation layer 232 over each unit cell 212. The four-band detector 210 further includes a first absorption layer 214 that is n-type, a second absorption layer 216 that is p-type, a third absorption layer 217 that is p-type, and a fourth absorption layer 215 that is n-type. Disposed between the first 214 and second 216 layers is a first barrier layer 224a that is n-type. Disposed between the second 216 and third 217 layers is a second barrier layer 224b that is a p-type HBT barrier similar to that detailed above for the three-band detector 110. Disposed between the third 217 and fourth 215 layers is a third barrier layer 224c that is n-type. The four-band detector 210 detects incident radiation in the bands 0–3 μm (SWIR), 0–4 μm (MWIR$_1$), 4–10 μm (MWIR$_2$), and 5–10 μm (LWIR). Specifications for the layers of an exemplary embodiment are set forth below in Table 3, including layer thicknesses, doping concentrations, type, and the x value (mole fraction) of the dopant $Hg_{1-x}Cd_xTe$.

TABLE 3

Sample Layer Specificatons for a Four-Color Detector

| | Thickness (μm) | Doping (cm$^{-3}$) | Type | x-Value |
|---|---|---|---|---|
| 1st absorption layer | 10 | 1–3 * 10$^{15}$ | n-type | 0.22 |
| 1st barrier layer | 1 | 3–10 * 10$^{16}$ | p-type | 0.46 |
| 2nd absorption layer | 6 | 3–10 * 10$^{16}$ | p-type | 0.30 |
| 2nd barrier layer | 1 | 3–10 * 10$^{16}$ | p-type | 0.4 |
| 3rd absorption layer | 6 | 3–10 * 10$^{16}$ | p-type | 0.325 |
| 3rd barrier layer | 1 | 3–10 * 10$^{16}$ | p-type | 0.46 |
| 4th absorption layer | 6 | 1–3 * 10$^{15}$ | n-type | 0.4 |

Figure 8A:
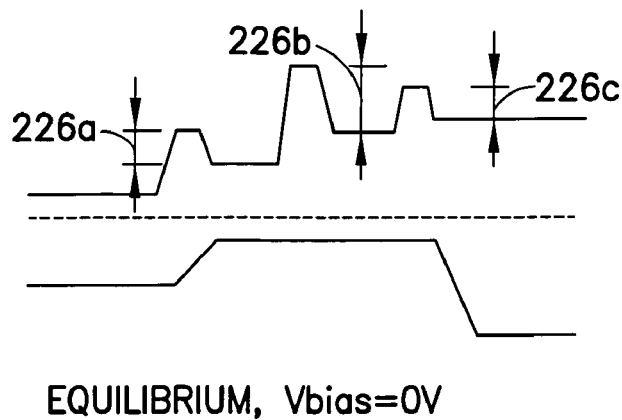
FIGS. 8(a)–(h) depict basic band structures and forms a functional description of a 4-color detector operating under a bias.
Figure 8B:
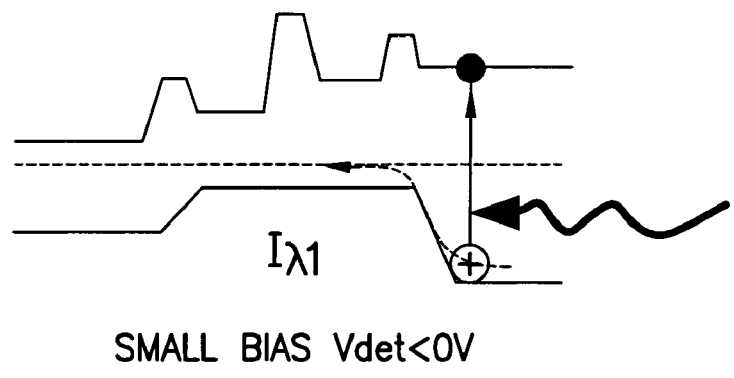
Figure 8C:
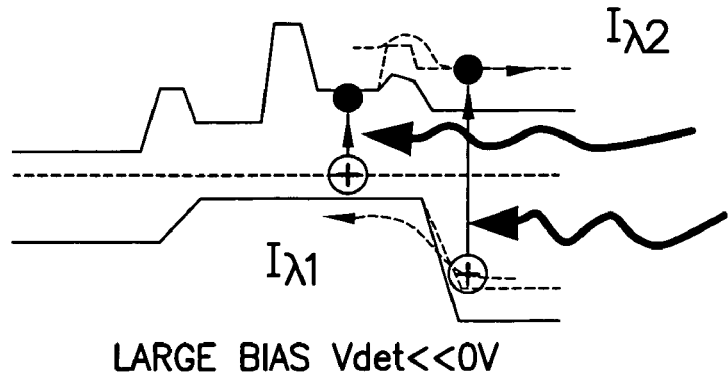
Figure 8F:
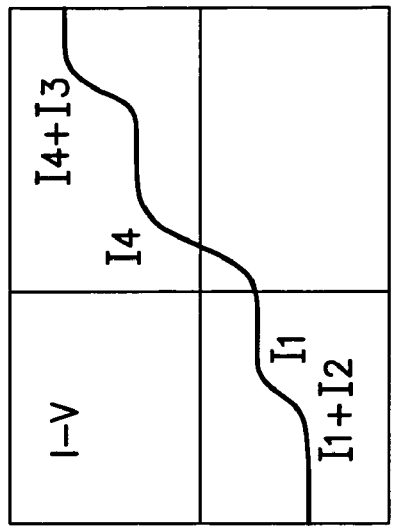
Figure 8G:
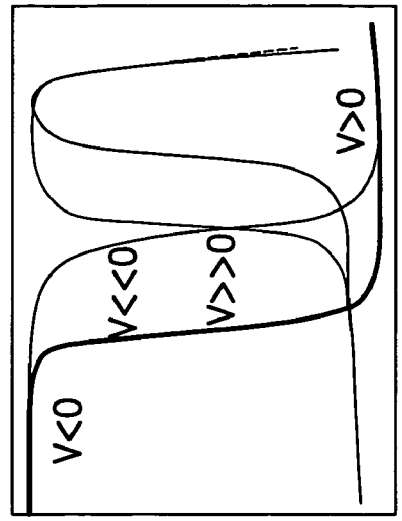
Figure 8D:
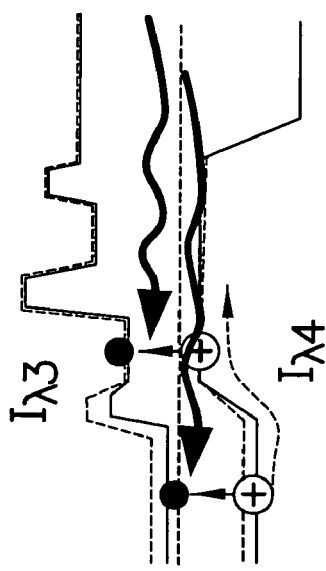
Figure 8E:
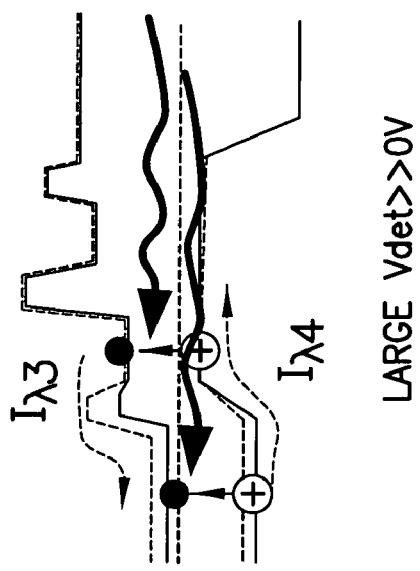
Figure 8H:
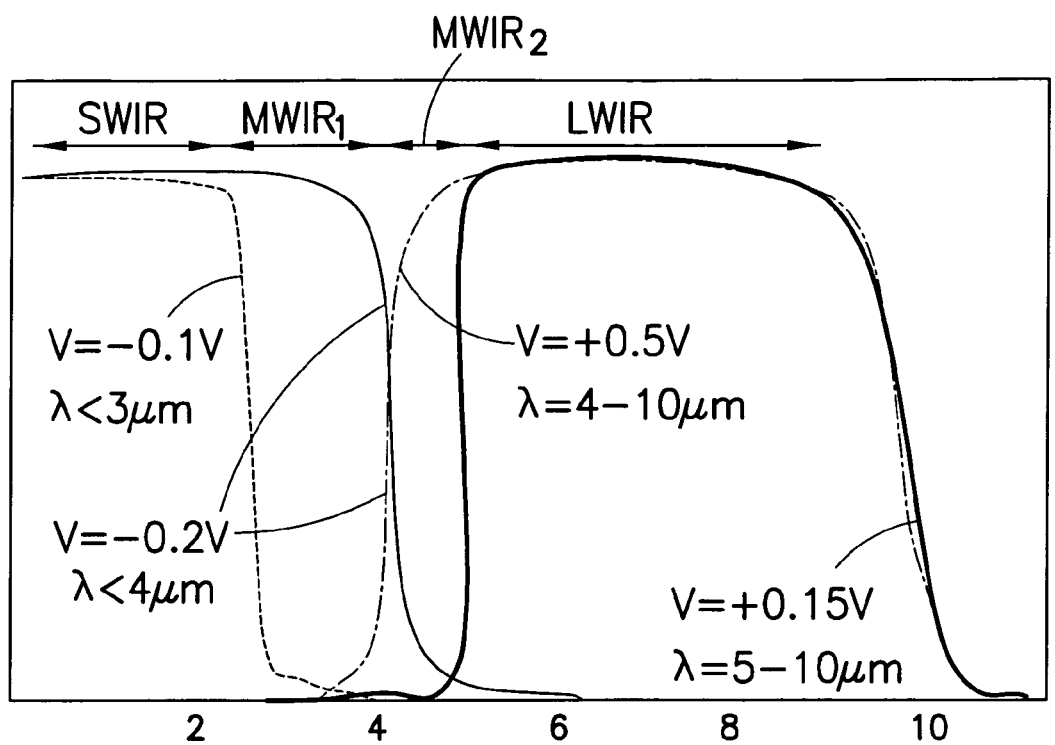

FIGS. 8(a) to 8(g) diagram behavior of the four-band detector 210 qualitatively. Respective potential barriers 226a, 226b, 226c are shown in FIG. 8(a) for the first 224a, second 224b, and third 224c barrier layers. As shown in FIG. 8(b), under a small negative bias, SWIR is absorbed at the fourth absorption layer 215 and generates a photocurrent $I_{\lambda 1}$. In FIG. 8(c) under a large negative bias SWIR is absorbed at the fourth absorption layer 215 which generates a photo-current $I_{\lambda 1}$, and MWIR$_1$ is absorbed at the third absorption layer 217 which generates a photocurrent $I_{\lambda 2}$, yielding a total photocurrent of $I_{\lambda 1}+I_{80\ 2}$. In FIG. 8(d) under a small positive bias LWIR is absorbed at the first absorption layer 214 which generates a photocurrent $I_{\lambda4}$, which is the total photocurrent. In FIG. 8(e) under a small positive bias LWIR is absorbed at the first absorption layer 214 which generates a photocurrent $I_{\lambda4}$, and MWIR$_2$ is absorbed at the second absorption layer 216 which generates a photocurrent $I_{\lambda3}$, yielding a total photocurrent of $I_{\lambda4}+I_{\lambda3}$. Current versus voltage is shown qualitatively in FIG. 8(f), and spectral response is shown in FIG. 8(g). Quantitative spectral response is shown in FIG. 8(h), where large negative bias is about −0.1 V; small negative bias is about −0.2 V; small positive bias is about 0.5 V; and large positive bias is about 0.15 V.

The apparatus invention gives rise to a method of detecting infrared energy in different energy bands. The method includes providing a detector with unit cells defining at least two absorption layers separated by a barrier layer, and imposing a low bias in one of a forward and reverse direction across at least one unit cell of the detector. Next, a first photocurrent is measured at the at least one unit cell that represents absorption in a first energy band. A higher bias is imposed in the one of the forward and reverse direction across at least one unit cell of the detector, which may be the same or another unit cell, and may occur before or after the low bias condition. A second photocurrent is measured at the at least one unit cell that represents absorption in both a first and second energy band. The first photocurrent is subtracted from the second photocurrent to resolve energy detected in the second energy band.

Where the detector includes three or four band sensitivity, the same occurs in the opposite bias direction, sensing a third photocurrent when a low bias in the other direction is imposed, and sensing a fourth photocurrent when a higher (in absolute terms) bias in that other direction is imposed. The third photocurrent is subtracted from the fourth by relatively simple circuitry known in the art, and the absorption by only the fourth layer (where the fourth layer is the one responsive only at high bias in the other direction) is proportional to the resultant current. Thus, two, three, or four bands may be separately detected by the above method, or more if the inventive method is merely continued with different layers of unit cells responsive to different bands as described above.

As with all the specific embodiments of the detectors 10, 100, 210 presented herein, n-type and p-type doping may be reversed as compared to that described, and potential barrier heights may be changed due to modifying doping concentrations or dopants to change the specific wavelengths of absorbed energy that is allowed to generate a photocurrent. Modification of barrier layers may also be used to modify the wavelength-dependent filtering effect of the various barrier layers. Additional absorption layers and barrier layers may be used to add different bands to achieve a detector capable of detecting more than four bands in accordance with the teachings herein. Various absorption layers may be directed to different energy bands, not necessarily bounded by the LWIR/MWIR/SWIR cutoffs cited herein. One key feature is that, for each transition between bands that generate current at a different bias direction (e.g., forward to reverse transition), the barrier layer between them should be a HBT barrier layer to suppress a diffusing electron current and minimize or eliminate a transistor effect that would otherwise occur.

The foregoing description has provided by way of exemplary and non-limiting examples a full and informative description of the best method and apparatus presently contemplated by the inventors for carrying out the invention. However, various modifications and adaptations may become apparent to those skilled in the relevant arts in view of the foregoing description, when read in conjunction with the accompanying drawings and the appended claims. As but some examples, the use of other similar or equivalents may be attempted by those skilled in the art. However, all such and similar modifications of the teachings of this invention will still fall within the scope of this invention.

Furthermore, some of the features of the present invention could be used to advantage without the corresponding use of other features. As such, the foregoing description should be considered as merely illustrative of the principles of the present invention, and not in limitation thereof.

What is claimed is:

1. A detector of incident radiation in the infrared region comprising:
    at least one detector unit cell; and
    a common contact and a contact bump coupled to the at least one unit cell for imposing a bias condition across the unit cell; wherein the unit cell comprises:
    a first absorption layer for outputting one of a n-type or a p-type charge carrier current that is proportional to absorption of energy in a first band when a bias in a first direction is imposed across the unit cell;
    a second absorption layer for outputting the other of a n-type or a p-type charge carrier current that is proportional to absorption of energy in a second band when a bias in the first direction is imposed across the unit cell; and
    a barrier layer disposed between the first and second absorption layers that allows photocurrent from the first absorption layer to flow when said bias in the first direction is below a threshold voltage and that allows photocurrent from both the first and second absorption layers to flow when said bias in the first direction exceeds the threshold voltage.

2. The detector of claim 1 comprising an array of unit cells, each unit cell defining a separate contact bump.

3. The detector of claim 1 wherein the first absorption layer outputs an n-type charge carrier current and the first band is long wavelength infrared; and wherein the second absorption layer outputs a p-type charge carrier current and the second band is short wavelength infrared.

4. The detector of claim 3 wherein the first absorption layer is disposed between the contact bump and the barrier layer.

5. The detector of claim 1 wherein the barrier layer defines a thickness no greater than about 10% of the thickness of the thinner of the first and second absorption layers.

6. The detector of claim 1 wherein the barrier layer imposes an electric potential barrier of about 0.05 meV at zero phase and zero bias.

7. The detector of claim 1 wherein the first and second absorption layers, and the barrier layer, comprise $Hg_{1-x}Cd_xTe$; wherein the value of x in the barrier layer exceeds the value of x in each of the first and second absorption layers.

8. The detector of claim 1 wherein the unit cell further comprises:
    a third absorption layer for outputting the one of a n-type or a p-type charge carrier current that is proportional to absorption of energy in a third band when a bias in a second direction opposed to the first direction is imposed across the unit cell; and
    a second barrier layer disposed between the second and third absorption layers that obstructs current from flowing from the third absorption layer when a bias in the first direction is imposed across the unit cell.

9. The detector of claim 8 wherein the second barrier layer passively suppresses a diffusing electron current.

10. The detector of claim 8 wherein an electric potential barrier imposed by the second barrier layer exceeds an electrical potential barrier imposed by the first barrier layer at least at zero bias and zero phase.

11. The detector of claim 10 wherein the electron potential barrier imposed by the second barrier layer exceeds that imposed by the first barrier layer by about fifty meV.

12. The detector of claim 8 wherein the second barrier layer is of the same n-type or p-type as each of the second and third absorption layers.

13. The detector of claim 8 wherein the unit cell further comprises:
 a fourth absorption layer for outputting the other of a n-type or a p-type charge carrier current that is proportional to absorption of energy in a fourth band when a bias in a second direction opposed to the first direction is imposed across the unit cell; and
 a third barrier layer disposed between the fourth and third absorption layers that allows photocurrent from the fourth absorption layer to flow when said bias in the second direction is below a threshold voltage and that allows photocurrent from both the fourth and third absorption layers to flow when said bias in the second direction exceeds the threshold voltage.

14. The detector of claim 13, wherein an electric potential barrier imposed by the second barrier layer exceeds an electric potential barrier imposed by each of the first and third barrier layers.

15. The detector of claim 13 wherein the threshold voltage for the bias in the second direction is about −0.1 volts.

16. The detector of claim 15 wherein the threshold voltage for the bias in the first direction is about +0.15 volts.

17. A method of detecting infrared energy in different energy bands comprising:
 providing a detector with unit cells defining at least two absorption layers separated by a barrier layer;
 imposing a first bias in one of a forward and reverse direction across at least one unit cell of the detector;
 measuring a first photocurrent at the at least one unit cell that represents absorption in a first energy band;
 imposing a second bias in the one of the forward and reverse direction across at least one unit cell of the detector;
 measuring a second photocurrent at the at least one unit cell that represents absorption in both a first and second energy band; and
 determining a difference between the first and second photocurrents resolve energy detected in the second energy band.

18. The method of claim 17, wherein providing a detector with unit cells defining at least two absorption layers separated by a barrier layer comprises providing a detector defining a first and third absorption layers of a first n-or-p type and a second absorption layer flanked by a first and second barrier, layers disposed between the first and third absorption layer, the second absorption layer and the first and second barrier layers being of the other of the n-or-p type; the method further comprising:
 imposing a bias in the other of the forward and reverse direction across at least one unit cell of the detector; and
 measuring a third photocurrent at the at least one unit cell that represents absorption in a third energy band.

19. The method of claim 18, wherein providing a detector with unit cells defining at least two absorption layers separated by a barrier layer comprises providing, in order, a first absorption layer or a first n-or-p type, a first barrier layer of the first type, a second absorption layer of the other of the n-or-p type, a second barrier layer of the other type, a third absorption layer of the other type, and a fourth absorption layer of the first type; the method further comprising:
 imposing a third bias in the other of a forward and reverse direction across at least one unit cell of the detector;
 measuring a third photocurrent at the at least one unit cell that represents absorption in a third energy band;
 imposing a fourth bias in the other of the forward and reverse direction across at least one unit cell of the detector;
 measuring a fourth photocurrent at the at least one unit cell that represents absorption in both a third and fourth energy band; and
 determining a difference between the third and fourth photocurrents to resolve energy detected in the fourth energy band.

* * * * *